United States Patent [19]

Paterson et al.

[11] Patent Number: 4,697,330
[45] Date of Patent: Oct. 6, 1987

[54] FLOATING GATE MEMORY PROCESS WITH IMPROVED DIELECTRIC

[75] Inventors: James L. Paterson; Boger A. Haken, both of Richardson, Tex.

[73] Assignee: Texas Instruments Incorporated, Dallas, Tex.

[21] Appl. No.: 867,178

[22] Filed: May 27, 1986

Related U.S. Application Data

[62] Division of Ser. No. 469,075, Feb. 23, 1983, Pat. No. 4,613,956.

[51] Int. Cl.$^4$ .......................................... H01L 21/425
[52] U.S. Cl. .......................................... 437/42; 437/43
[58] Field of Search .................. 29/571, 576 B, 578, 29/591; 148/187; 357/23.5

[56] References Cited

U.S. PATENT DOCUMENTS

| | | | |
|---|---|---|---|
| 4,409,723 | 10/1983 | Harari | 29/571 |
| 4,451,904 | 5/1984 | Suguira et al. | 365/185 X |
| 4,456,978 | 6/1984 | Morley et al. | 357/23.5 X |
| 4,495,693 | 1/1985 | Iwahashi et al. | 29/571 |
| 4,532,022 | 7/1985 | Takasaki et al. | 357/23.5 X |
| 4,581,622 | 4/1986 | Takasaki et al. | 357/23.5 X |
| 4,630,086 | 12/1986 | Sato et al. | 357/23.5 |

Primary Examiner—George T. Ozaki
Attorney, Agent, or Firm—Douglas A. Sorensen; Leo N. Heiting; Mel Sharp

[57] ABSTRACT

The dielectric between the floating gate and the control gate, in an EEPROM or other floating gate memory is made by forming an oxide/nitride stack over the (first polysilicon) control gate. This dielectric not only provides a very high specific capacitance, which is desired to provide tight coupling of the control to the floating gate, but also provides excellent dielectric integrity. Moreover, the thickness of this dielectric layer does not exhibit any uncontrolled increase during exposure to second gate oxidation. Thus, the polysilicon-to-polysilicon dielectric is not only of high specific capacitance and high integrity, it is also very uniform.

45 Claims, 11 Drawing Figures

FLOATING GATE MEMORY PROCESS WITH IMPROVED DIELECTRIC

This is a division of application Ser. No. 469,075, filed Feb. 23, 1983, now U.S. Pat. No. 4,613,956.

BACKGROUND AND SUMMARY OF THE INVENTION

The present invention relates to a method for fabricating a floating gate memory.

One of the key process issues for realizing high performance analog and digital circuits is the ability to fabricate precision, high value, polysilicon to polysilicon capacitors at the same time as low resistance polysilicon gates and interconnects.

A common technique for producing polysilicon to polysilicon capacitors is to lightly dope the first level of polysilicon (bottom plate) to 100 ohms per square, so a very uniform dielectric can be grown on polysilicon at the same time the gate oxide is regrown. Second level polysilicon is then used as the top plate.

The main limitation with this technique is that the capacitor's dielectric thickness, and hence maximum value, is controlled by the regrown gate oxide thickness. For a 700 Å gate oxide process this increases the dielectric to about 1100 Å (oxide grows faster on doped polysilicon), resulting in a capacitance of 0.2 pF/mil$^2$.

This problem is particularly acute in floating gate memories, such as EPROMs, EEPROMs, and other floating gate technologies. Such floating gate technologies are widely used to achieve a nonvolatile memory by storing charge in the floating gate by tunnel or avalanche injection through a thin dielectric adjacent to the gate, usually a dielectric between the gate and the substrate.

In such memories, normally a reverse process is used. That is, the first polysilicon level is used for the floating gates which are totally encapsulated and isolated portions of polysilicon. The control gates for each cell, and any other necessary transistors, are formed in the second polysilicon level.

As floating memories are scaled down, the problem is to lower the operating voltage while retaining essentially the same voltage swing on the floating gate. That is, if the write voltage which can be applied to the control gate is scaled down from 20 volts to 15 volts, it is highly desirable to be able to still apply the same voltage swing to the floating gate with a 15 volt control signal as was previously possible with a 20 volt control signal. To accomplish this, very close coupling between the floating gate and the control gate is required. This in turn requires very high specific capacitance between the floating gate and the control gate.

A complicating factor in achieving this necessary high specific capacitance is that a very good quality insulator is needed. Not only is integrity essential under the high dielectric stress imposed by the high voltages necessarily used for writing in a floating gate memory, but also leakage between the floating gate and the control gate imposes another very important parameter. That is, since information is stored by charges trapped in the floating gate, one of the critical limitations on device performance is imposed by the leakiness of the dielectric between the floating gate and the control gate, since this provides one of the critical leakage paths.

Thus it is an object of the present invention to provide a floating gate memory cell having a very high specific capacitance between the floating gate and the control gate.

It is a further object of the present invention to provide a floating gate memory cell in which the specific capacitance between the floating gate and the control gate is very high, and the dielectric integrity between the floating gate and the control gate is also very high.

It is a further object of the present invention to provide a method for fabricating a floating gate memory cell in which the specific capacitance between the floating gate and the control is very high in which the leakage resistance between the floating gate and the control gate is also extremely high.

A further difficulty in the prior art of floating memories is that many floating gate memory processes have strayed far afield into the realm of exotic processing techniques. While the requirement of injecting charge through an insulator into the floating gate necessarily requires some unusual processing techniques, to provide a good quality dielectric and to withstand the high write voltages required, exotic fabrication processes can impose a heavy burden of reliability and cost.

Thus it is an object of the present invention to provide a method for fabricating capacitors having high specific capacitance for large and high dielectric strength.

It is a further object of the present invention to provide a method for fabricating capacitors having high specific capacitance in a standard MOS process.

Forming a precision capacitor over a first polysilicon level is particularly difficult, since the surface of the first polysilicon level will never be as smooth as that of a monocrystalline polished semiconductor surface, that is, the surface of even good polysilicon will normally have a certain amount of unevenness. This unevenness can significantly affect the thickness of an oxide which is formed over the polysilicon. It not only leads to uncertainty in the average specific capacitance, but also can cause formation of areas where an oxide grown over polysilicon is locally thin.

Thus it is a further object of the present invention to provide a method for reliable fabrication of uniform dielectrics over a polysilicon level. The roughness of the polysilicon surface means that pinholing through a dielectric grown over first polysilicon can occur. This problem becomes particularly serious if the dielectric is a thin one, as is required for high specific capacitance. This is a major concern in floating gate memories, since the large total area devoted to capacitors means that even a small density of capacitor pinholes can cause drastic yield degradation.

Thus it is a further object of the present invention to provide a thin polysilicon to polysilicon dielectric having a very low density of pinholes.

In double polysilicon processes, a regrown gate oxide is normally used to form transistors having second polysilicon gates. That is, after the first polysilicon level has been completely formed, the areas where transistors in second polysilicon are to be formed are cleared down to silicon, and the gate oxides for second polysilicon transistors are grown from scratch. However, the oxidizing conditions which permit growth of the second gate oxide also promote growth of oxide over the first polysilicon level. Moreover, oxide normally grows faster on doped polysilicon than on crystalline silicon under the same conditions, so that a thicker oxide will be formed over the first polysilicon level. Where the oxide has already been formed over the first polysilicon level before growth of the second gate oxide, as is typical, the oxide thickness over the first polysilicon will be increased by the oxidizing conditions.

The second gate oxide will of course normally be grown to a precisely controlled thickness, but the simultaneous thickness increase of the oxide over the first polysilicon may be poorly controlled. The chief reason for this is because of doping uncertainty. The oxidizing rate is a function of the polysilicon doping level, and the doping level itself cannot be precisely controlled in highly conductive $POCl_3$-doped polysilicon. Even if the polysilicon doping is performed by ion implantation, the average doping level in polysilicon will still be sensitive to the thickness of the polysilicon level deposited, which is also normally not a parameter which can be precisely controlled.

Thus it is an object of the present invention to provide a method for growth of a second gate oxide without any uncontrolled change in the thickness of an existing oxide over a first polysilicon level.

Thus it is an object of the present invention to provide a method for growth of a second gate oxide without simultaneously growing a thick oxide over first polysilicon.

It is a further object of the present invention to provide a method for growing a second gate oxide without increasing the thickness of a dielectric over a first polysilicon level.

In the present invention a composite oxide/nitride or oxide/nitride/oxide dielectric is used over the first polysilicon level instead of the thermal oxide taught by the prior art. This means that very thin dielectrics can be used over first polysilicon which have very high dielectric integrity (low level of pinholes) and very high dielectric strength (breakdown voltage). Moreover, the dielectrics formed by the present invention are virtually unaffected by the normal second gate oxide growth cycle, so that the problem of uncontrolled thickness increase vanishes.

The problems described above are exacerbated in high voltage circuits, and particularly in floating gate memory circuits. Since the second oxide thickness must be extremely high in these circuits anyway to prevent gate/drain breakdown and excessive injection of hot carriers into the second gate oxide, the problem of thickening of the oxide over the first polysilicon during the growth of the second polysilicon is exacerbated. That is, a typical thickness for the second gate oxide in a high voltage (21 volt )EEPROM process would be 600 Angstroms, and while 600 Angstroms of oxide are grown on silicon typically 1000 Angstroms will be grown on doped polysilicon or the thickness of an existing oxide layer on polysilicon would be increased.

The present invention fabricates improved floating gate memory cells using high voltage polysilicon to polysilicon capacitors with a much higher capacitance/unit area, e.g. 0.8 $pF/mil^2$. The technique utilizes a composite oxide/nitride/oxide dielectric whose thickness is controlled independently of the regrown gate oxide, without the requirement of an extra mask. The composite dielectric has very good integrity; typical breakdown for a 350 Å composite layer is 24–30 V. Leakage measurements indicate characteristics similar to polysilicon capacitors with an 800 Å thermally grown oxide. In some of the test experiments the oxide and nitride layers were formed by LPCVD. These have exhibited high uniformity, better than 0.005%/mil or 3% across a 3" slice. A further advantage of using an LPCVD dielectric is that first polysilicon can be doped to about 15 ohms per square since it is no longer necessary to thermally grow a uniform oxide. This gives the designer the flexibility of using both heavily doped 1st polysilicon and silicided 2nd polysilicon for interconnect.

It is a further object of the present invention to provide a method for fabricating high voltage MOS integrated circuits, in which the thickness of the dielectric between the first and second polysilicon levels can be selected to be equal to or less than the thickness of the second gate oxide.

A method for making a floating gate memory, comprising the steps of:
providing a semiconductor substrate;
forming a first gate insulator layer on said substrate;
forming a first insulated conductor layer over said substrate, said conductor layer being polycrystalline and comprising silicon;
forming a layer of silicon dioxide over said first conductive layer;
forming a layer of silicon nitride over said first conductive layer;
patterning said first insulated conductor layer, to define a plurality of desired floating gates;
providing an oxidizing atmosphere to form gate insulators in selected locations;
forming a second conductive layer in predetermined locations, said second condutive layer comprising control gate portions over said floating gates in said first conductive layer; and
implanting a plurality of source and drain regions on opposite sides of the respective ones of said floating gates;
whereby a floating gate memory cell having very high specific capacitance between said respective floating gates and said respective control gates is formed.

BRIEF DESCRIPTION OF THE DRAWING

The present invention will be described with reference to the accompanying drawings, wherein.

DESCRIPTION OF THE PREFERRED EMBODIMENTS

Figure 1:
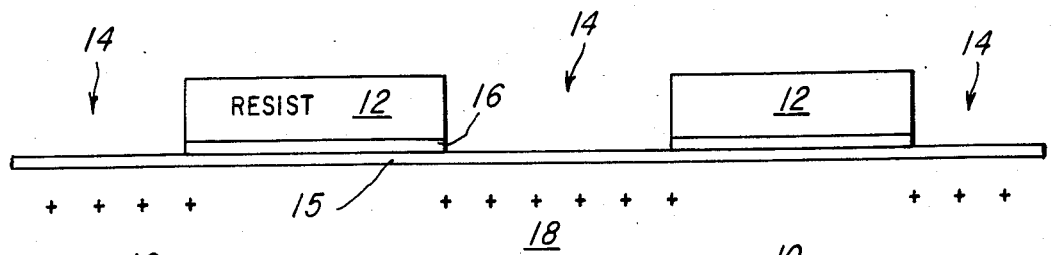
FIGS. 1–8 show a process sequence for fabricating an EPROM cell according to the present invention. The various steps in fabrication of a transistor in the peripheral circuits are shown in the left of each drawing, and the corresponding steps in fabricating the storage elements in the array are shown in the right half of each drawing.
Figure 2:
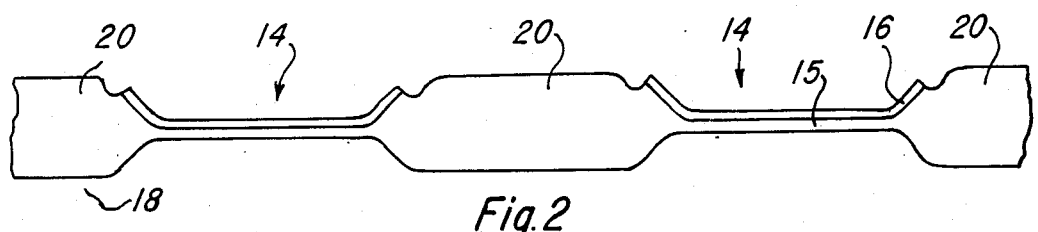

FIGS. 1–8 show the present invention applied in a high voltage floating gate (EPROM) process. The processing used in fabricating an EPROM cell according to the present invention will first be described generally, and then in greater detail.

The key process steps which permit realization of the thin dielectric according to the present invention are as follows:

After the first gate oxide has been grown, the first level of polysilicon is deposited and doped with $POCl_3$.

A thin layer of low pressure CVD silicon dioxide is now deposited (or alternatively thermally grown) to a thickness of 200 Angstroms. Next, about 200 Angstroms of low pressure CVD silicon nitride is deposited.

The prior art has frequently used thermally grown oxides over first polysilicon levels. However, the difficulty in this case is that, if a good thermal oxide is to be grown over a first polysilicon level, the first polysilicon level must have a relatively low doping. That is, the conductivity of the first polysilicon level in this case cannot be made much less than about 100 ohms per square, which means that the first polysilicon level is useless for interconnects. However, if a deposited oxide is used over the first polysilicon level, the first polysilicon level can be highly doped. The chief question would appear to be whether the deposited oxide can be deposited with sufficient uniformity. This has been found to be the case.

Thus, it may be preferable to use a deposited rather than a grown first oxide layer for the polysilicon to polysilicon dielectric, but in either case the present invention can be used.

In one embodiment of the present invention, deposition of the oxide and nitride layers is accomplished by a *single-reactor* multi-dielectric deposition process. The preferred embodiment of this process will now be described in detail.

Preferably a tube reactor is used to deposite low pressure CVD films of nitride and oxide, and optionally also to deposite polysilicon and to perform oxidation. The key feature is that the reactor is kept at the same temperature during all of the various deposition phases applied. *This is critical.* The available precision of furnace control will naturally impose limits on the exact constancy of temperature which can be achieved, but it is preferable that the amount of thermal cycling of the deposition furnace be kept to an absolute minimum. Thermal cycling will tend to release particulates, which is a crucial hazard in any chemical deposition process. In particular, the release of particulates is a particular hazard where nitride is being deposited.

All depositions are LPCVD processes. The preferred oxide deposition is not a standard process, since the process parameters have been adjusted so that the oxide deposition can be performed at the same temperature (800° C. in this embodiment) as the other deposition and oxidizing steps. For oxide deposition, the flow rate used in the presently preferred embodiment is 30 sccm of dichlorosilane and 150 sccm of nitrous oxide, at a total pressure of 500 millitorr. The total pressure can be regulated, for example, by a pump purge of pure nitrogen, which is throttled to keep the tube pressure up to the desired level.

The preferred nitride deposition parameters use the standard Thermco process. That is, 30 sccm of dichlorosilane and 90 sccm of ammonia are flowed at a total pressure of 130 millitorr. Again, the temperature is 800° C.

To perform oxidation, a pure oxygen atmosphere is used, again at the same temperature as the other processing steps in the same reactor (800° C.). At present, due to pump constraints, it is preferred that the oxygen pressure be kept below 150 torr, but this is not a strictly necessary limitation.

Polysilicon can also be grown in the same reactor, without removing the slice from the reactor. The preferred process parameters for polysilicon deposition are 30 sccm of dichlorosilane at a total pressure of 170 millitorr net 800° C. (In the present mode of operation, a nitrogen purge is varied to adjust the pressure as desired.)

Thus, any of these four process steps can be applied in any sequential combination, without removing the slice from the reactor. This provides major advantages in VLSI processing, of several kinds. First, in any deposition reactor, every load operation imposes a risk of particulates being dislodged from the carrier or furnace lock. Secondly, everytime a slice is exposed to the air, even in a clean room, a substantial risk of particulate matter suffering electrostatic binding to the slice, and particularly to insulating areas on the slice, is incurred. Third, handling damage risks are of course reduced when no handling is used between furnace steps.

As is well known in the art of furnace deposition, it is normally necessary to clean deposited matter off the furnace walls periodically, e.g. by wet etching.

The furnace used is preferably a hot wall furnace, i.e. a tube which is heated by resistance heaters outside of the tube. However, a susceptor-heated furnace or other furnace could alternatively be used. Thus, the present invention can be practiced (although this is not the most preferred embodiment) by, after the first polysilicon level is in place and patterned, applying an oxide layer, applying a nitride layer, applying an oxidizing ambient to partially reoxidize the nitride layer, and then applying a second polysilicon layer. All of these steps could be performed sequentially without removing the slice from the reactor or maneuvering it at all. It is only after the second polysilicon layer has been deposited that the slice must be removed for doping and etching of the second poly layer.

In an alternative embodiment of the invention, a three layer dielectric stack is applied prior to the reoxidation step. That is, an oxide layer is deposited (or grown), a nitride layer is deposited on the oxide layer, and then another oxide layer is deposited on the nitride layer, prior to the oxidizing step which forms the second gate oxide. Slight additional oxidation of the nitride may take place during the gate oxide regrowth step, but this depends on the thickness of the top oxide. In one embodiment of the invention, a 100 Angstrom layer of oxide is deposited, followed by a 200 Angstrom layer of nitride, followed by a 100 Angstrom layer of oxide. In this case, significant oxidation of the nitride will typically take place when the second gate oxide is grown (e.g. 10 Angstroms of the nitride may be oxidized) This embodiment provides even further resistance to dielectric thickness increase and even better integrity, but at the cost of a somewhat greater process complexity.

The first level of polysilicon and the overlying dielectric are now patterned, to define the floating gates. (The gate oxides for peripheral transistors (second polysilicon gates) will be formed later). The first gate oxide under the first polysilicon level is also etched at this time together with the first polysilicon. Alternatively, the first gate oxide can be stripped following the first polysilicon level etch in HF.

The second gate oxide 20 is then grown to a thickness of, e.g., 600 Angstroms, which at the same time partially oxidizes the 200 Angstrom silicon nitride layer. However, the nitride oxidation is a self-limiting process, and only about 10 Angstroms of oxide forms on top of the nitride layer 18. This tends to plug up any pinholes in the thin nitride layer.

The layer of oxide is not only quite thin, but is also not truly separated from the nitride layer. That is, a region of graded oxide/nitride composition will exist instead of a sharp boundary, and for this reason the oxide layer is not shown separately in FIGS. 6–9. That is, it is more correct to refer to a composite layer than to separate layers.

This is a major source of the advantages of the present invention, in that, not only are the nitride pinholes out of alignment with the underlying oxide pinholes, but also the nitride pinholes themselves tend to be plugged by the reoxidation step.

After performing any transistor threshold adjustments, the second level polysilicon is deposited, doped (e.g. with phosphorous oxychloride) and patterned and etched in the peripheral circuits. A separate patterning step is used for the control gates. Any exposed nitride is also etched at this step.

The soruce/drain implants are then performed, and the refill oxide is grown.

Because silicon nitride has a higher dielectric constant than silicon dioxide (approximately 7 vs. 4), a layer of silicon nitride is electrically equivalent to a thinner layer of silicon dioxide. For example, in the present preferred embodiment, a 200 Angstrom layer of silicon nitride has the same approximate electrical thickness as 120 Angstroms of silicon dioxide, so that the total equivalent thickness of the dielectric layer formed is equivalent to about 350 Angstroms of silicon dioxide. This permits the formation of polysilicon capacitors with a specific capacitance in the neighborhood of 0.8 picofarads per square mil.

It should be noted that the uniformity of specific capacitance across the wafer is strongly dependent on the uniformity of the silicon nitride layer. However, low pressure chemical vapor deposition has been found to give excellent uniformity for nitride layers as thin as 100 angstroms.

Although formation of capacitors between two polysilicon levels has been primarily referred to, this is not strictly necesary. For example, the dielectric according to the present invention can easily be formed between a first polysilicon floating gate layer and a polycide (i.e. polysilicon/silicide composite), pure silicide, or metal top layer.

Moreover, it is also possible to form a thin uniform capacitor dielectric according to the present invention over a polycide or pure silicide first layer, although this is not the preferred embodiment of the invention. In this case, the oxide and nitride dielectric layers would both preferably be deposited. With silicide or polycide, as with polysilicon, the surface of the silicide layer will normally be uneven. Thus, the same difficulties caused by physical excursion exists with silicide or polycide as exists with polysilicon. Moreover, in silicide and polycide as in polysilicon, a significant fraction of dopant impurities will normally be included in the material, and these impurities which are uncontrolled will also affect the oxidation rate of the first plate material in an uncontrolled manner. Most silicides are susceptible to partial oxidation (nuisance oxidation) during the oxidizing condition which are used to form the second gate oxide, and therefore the present invention is useful to avoid growth of an uncontrolled thickness of silicon and metal oxides over a silicide bottom layer.

The process flow of the presently preferred embodiment will now be described in somewhat greater detail. This process flow fabricates an EPROM design for 21 volt operation. However, this device scales to other voltages, as will be discussed below. Moreover, the present invention is also directly applicable to EEPROM fabrication, as will be discussed below.

On a silicon substrate 10, 350 Angstroms of an initial oxide 15 and 1000 Angstroms of an initial nitride 16 are formed. A first resist level 12 is then patterned to define moat areas 14, in which active devices are to be formed. The initial nitride layer 16 is then etched to remove the nitride from the moat regions 14. At this point a channel stop implant is also performed, e.g. $1.7 \times 10^3$ per square centimeter of boron at an energy of 100 keV. This concentration of boron will form the channel stops 18. This results in the structure shown in FIG. 1.

Next, the resist level 12 is stripped. The channel stop implant 18 is in yield, and field oxidation is performed to provide a field oxide 20 which is approximately 1.3 microns thick. This produces the device structure shown in FIG. 2.

Figure 3:
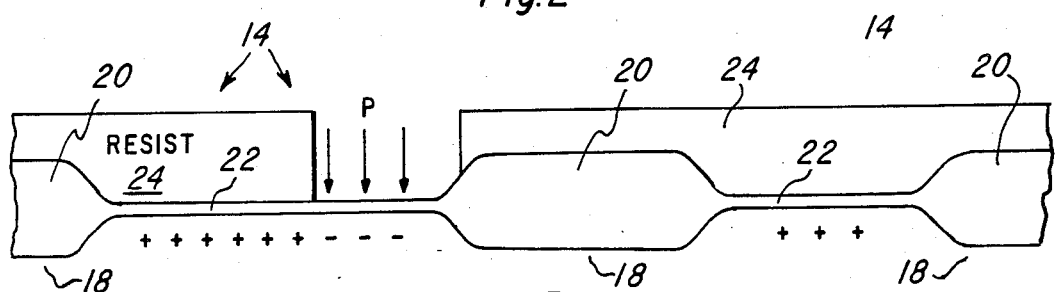
Figure 4:
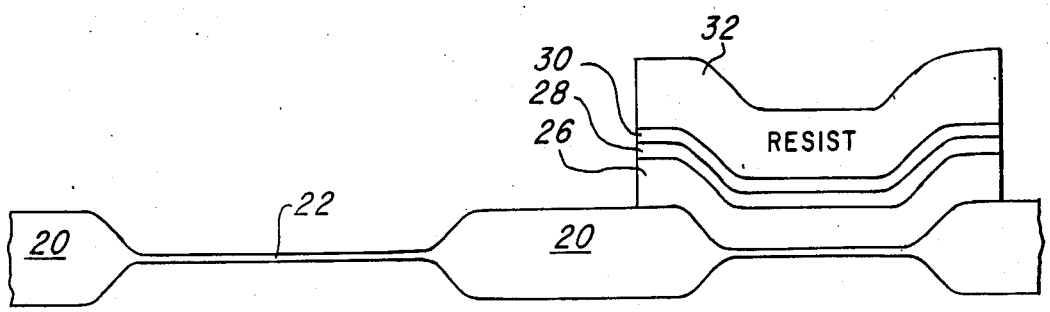
Figure 5:
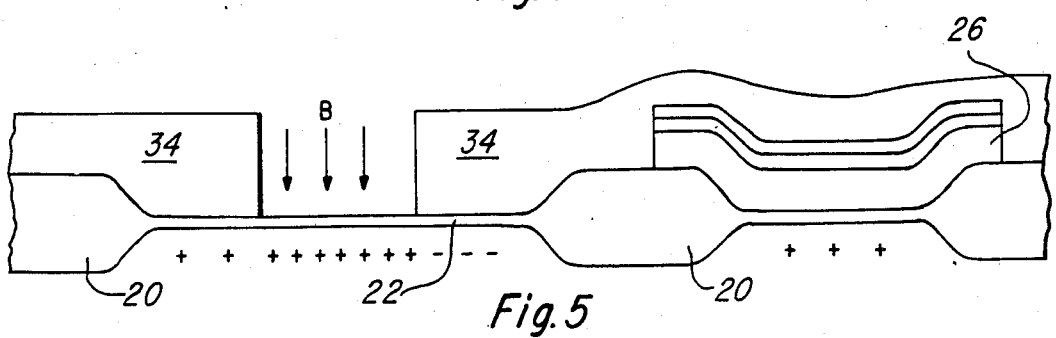

The initial nitride 16 and the initial oxide 15 are then stripped. Preferably a dummy gate oxide is grown at this point in the moat regions to a thickness of approximately that of the gate oxide which will follow, or 600 Angstroms in this embodiment. This dummy gate oxide is sacrificial, and is immediately stripped. The gate oxide 22 is then grown, e.g. to a thickness of 600 Angstroms. The threshold voltage implants are then performed. Note that threshold voltages for three kinds of transistors must be defined. In the presently preferred embodiment, boron is first implanted, at a dose of, e.g., $2.5 \times 10^{11}$ per centimeter squared at 35 keV, to define the threshold for the floating gate transistors and for the "natural" (enhancement-mode) devices. This is a blanket implant which is applied overall. Next, a resist layer 24 is patterned, and a phosphorus implant is used to define threshold voltages of the depletion transistors, e.g. at a dose of $1.15 \times 10^{12}$ per square centimeter and an energy of 150 keV. This step is shown in FIG. 3.

Figure 6A:
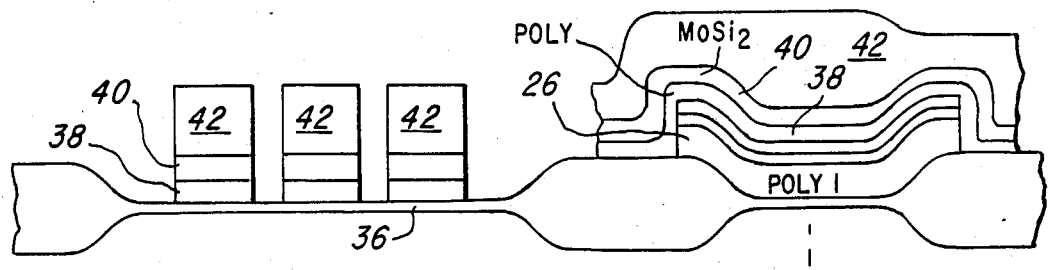

The resist layer 24 is then stripped, and the first polysilicon layer 26 (referred to as "polysilicon 1") is deposited and POCl$_3$ doped. The inner level oxide 28 and the interlevel nitride 30 are then formed or deposited, as extensively described above. A resist level 32 is then patterned to define the desired configuration of the polysilicon 1 level, and the nitride 30, the oxide 28, and the polysilicon 26 are anisotropically etched in accordance with the resist level 32. This results in the structure shown in FIG. 4. The resist level 32 is then stripped, and a further resist level 34 is then applied to pattern a further implant to set the voltages of enhancement transistors. For example, a boron implant of $3 \times 10^{11}/cm^2$ at 35 keV is preferably used. This results in the structure shown in FIG. 5. This resist level is then stripped. The first gate oxide 22 is then stripped away wherever it is exposed, and a second gate oxide 36 is then grown. As noted above, this same second gate oxidation step will also grow a small amount of oxide in the top portion of the inner level nitride layer 30. A second polysilicon level 38 is then deposited and doped, and a layer 40 of molybdenum silicide is also deposited overall. A mask layer 42 is now used to pattern the silicided second polysilicon level 38, 40 in the periphery. However, it should be noted that the second polycide 38,40 is not patterned at this time in the array. The second polycide layer 38,40 is then etched, resulting in a structure as shown in FIG. 6a.

The result level 42 is now stripped, and the silicided second polysilicon level 38,40 is patterned in the array. Anisotropic etches are now performed, according to a further resist layer 44, to cut through the silicide layer and second polysilicon layers 40,38, the interlevel oxynitride stack 28,30, and the first polysilicon level 26.

Figure 6B:
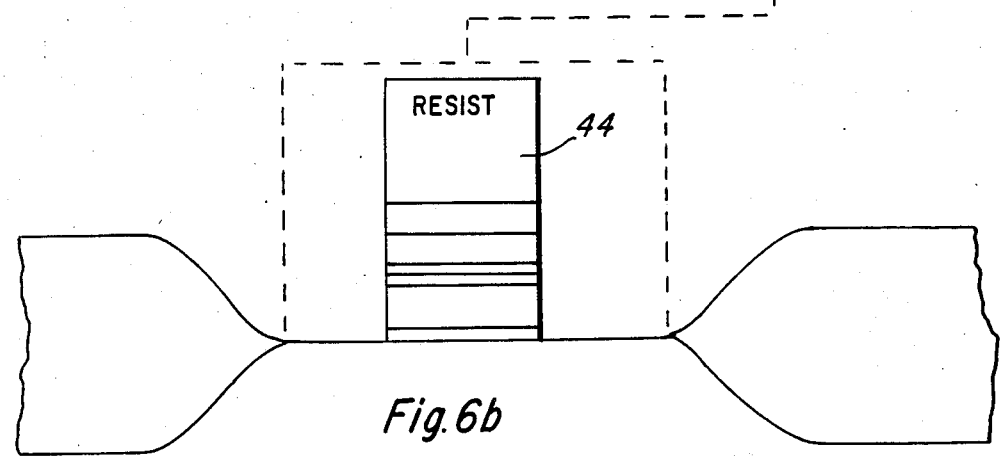

That is, a stack etch is preferably used, to produce a structure as shown in FIG. 6b.

Figure 7:
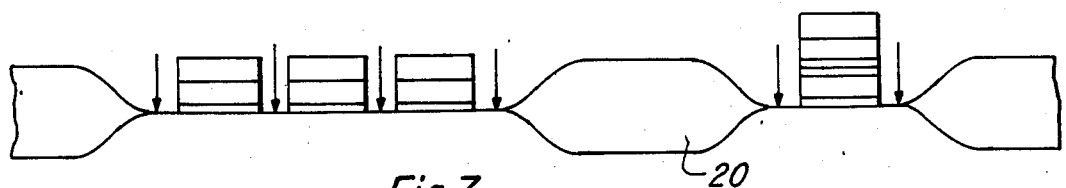

The resist level 44 is then stripped, as is any remaining portion of the second gate oxie 36, and arsenic is then implanted, preferably at a dose of $1 \times 10^{16}$ per centimeter squard at 50 keV, to form source/drain regions 46. This process step is shown in FIG. 7.

Figure 8A:
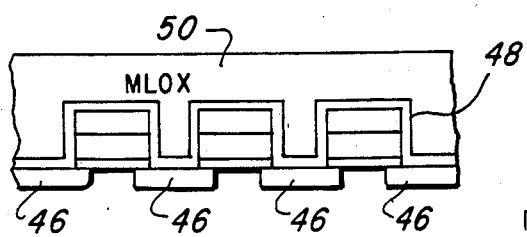
Figure 8B:
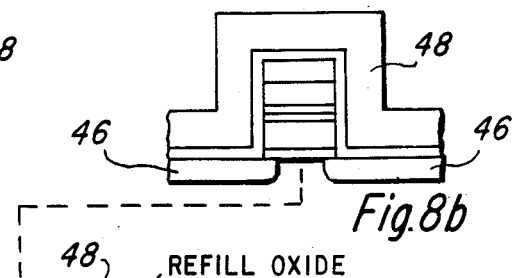
Figure 8C:
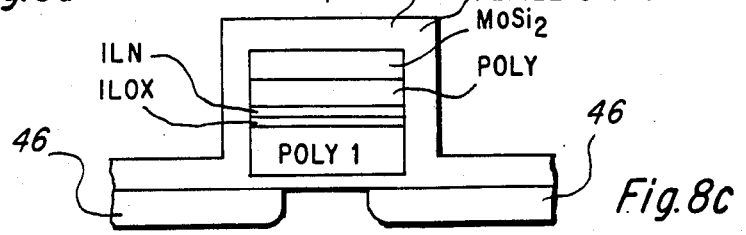

An implant anneal step is then performed, and a refill oxide 48 is then grown. Preferably this is a thermal oxide, since its purpose is to provide very good isolation of the floating gate portions of the first polysilicon 26. In particular, this refill oxide layer 48 serves to isolate the impurities used to obtain a low reflow temperature in a multilevel oxide 50 from the floating gates. A multilevel oxide is then applied, which results in the structure as shown in FIGS. 8a-8c. Processing continues with contact etching and metallization steps, to interconnect the devices thus formed to form a functional complete integrated circuit chip, but these steps are entirely conventional and well known to those skilled in the art.

The present invention has been described with reference to a 600 Angstrom gate oxide process for a 21 volt operating voltage, but this thickness is readily scalable. For example, the thicknesses of the first and second gate oxides can both be scaled down to 400 Angstroms with interlevel dielectric thicknesses as given to produce a 15 volt part. Scaling to other voltages is straightforward.

The present invention is also applicable to EEPROM parts. In EEPROMS, a separate very thin tunnel oxide is typically separately patterned underneath the first polysilicon level. For example, in a 21 volt part with 600 Angstrom gate oxides, a 150 Angstrom tunnel oxide can be used underneath the first polysilicon floating gate portions, to provide an area where tunneling is easy.

As will also be obvious to those skilled in the art, the present invention can be applied in a wide variety of other floating gate processes, wherever close capacitative coupling of an amorphous silicon-containing floating gate to an overlying control gate is desired.

The present invention advantageously provides a method for fabricating capacitors having high specific capacitance in a standard MOS process.

The present invention advantageously provides a thin polysilicon to polysilicon dielectric having a very low density of pinholes.

The present invention advantageously provides a method for growth of a second gate oxide without simultaneously growing a thick oxide over first polysilicon.

The present invention advantageously provides a method for growing a second gate oxide without increasing the thickness of a dielectric over a first polysilicon.

The present invention advantageously provides a method for forming polysilicon to polysilicon capacitors with highly uniform specific capacitance across the wafer.

The present invention advantageously provides a method for fabricating high voltage MOS integrated circuits, in which the thickness of the dielectric between the first and second polysilicon levels can be selected to be equal to or less than the thickness of the second gate oxide.

As will be obvious to those skilled in the art, the present invention provides a process innovation having very wide applicability, and can be practiced in the context of a very wide variety of integrated circuit processes, and with a very wide variety of modifications and variations. The scope of the claimed invention is therefore not limited except as specified in the accompanying claims.

What is claimed is:

1. A method for making a floating gate memory, comprising the steps of:
    providing a substrate having a semiconductor surface portion;
    forming a first gate insulator layer on said substrate;
    forming a first insulated conductor layer over said substrate, said conductor layer being polycrystalline and comprising silicon;
    forming a layer of silicon dioxide over said first conductive layer;
    forming a layer of silicon nitride over said first conductive layer;
    patterning said first insulated conductor layer, to define a plurality of desired floating gates;
    providing an oxidizing atmosphere to form gate insulators in selected locations;
    forming a second conductive layer in predetermined locations, said second conductive layer comprising control gate portions over said floating gates in said first conductive layer; and
    implanting a plurality of source/drain regions on opposite sides of the respective ones of said floating gates;
    whereby a floating gate memory cell having very high specific capacitance between said respective floating gates and said respective control gates is formed.

2. The method of claim 1, wherein said step of forming a layer of silicon dioxide over said first conductive layer is performed by growing said oxide.

3. The method of claim 1, wherein said step of forming a layer of silicon dioxide over said first conductive layer is performed by low-pressure chemical vapor deposition of said oxide.

4. The method of claim 1, wherein said first insulated conductor layer consists essentially of polycrystalline silicon.

5. The method of claim 1, wherein said substrate has a silicon surface portion, and wherein said step of providing an oxidizing atmosphere to form gate insulators in selected locations grows silicon dioxide on portions of said silicon surface portion.

6. The method of claim 1, wherein said substrate has a silicon surface portion, and wherein said step of providing an oxidizing atmosphere to form gate insulators in selected locations grows silicon dioxide on portions of said silicon surface portion which are not protected by said layer of silicon nitride.

7. The method of claim 1, wherein said step of forming a layer of silicon nitride over said first conductive layer is performed by low-pressure chemical vapor deposition.

8. The method of claim 1, wherein said step of forming a layer of silicon nitride over said first conductive layer is performed by plasma-enhanced chemical vapor deposition.

9. The method of claim 1,
    wherein said step of forming a layer of silicon nitride over said first conductive layer is performed by low-pressure chemical vapor deposition,
    and an oxide layer is formed over said nitride layer by low-pressure chemical vapor deposition before said nitride layer is exposed to an atmospheric ambient, all prior to said step of providing an oxidizing atmosphere to form gate insulators in selected locations.

10. The method of claim 1, wherein said second conductive layer consists essentially of a layered structure including both polycrystalline silicon and metal silicide portions.

11. The method of claim 1, wherein said second conductive layer consists essentially of doped polycrystalline silicon.

12. The method of claim 1, wherein said second conductive layer consists essentially of a metal silicide.

13. The method of claim 1, wherein said second conductive layer consists essentially of a metal.

14. The method of claim 1, wherein said first insulated conductor layer consists essentially of a layered structure including both polycrystalline silicon and metal silicide portions.

15. The method of claim 1, wherein said first insulated conductor layer consists essentially of doped polycrystalline silicon.

16. The method of claim 1, wherein said first insulated conductor layer consists essentially of a metal silicide.

17. A method for making a floating gate memory, comprising the steps of:
   (a) providing a body having a semiconductor surface portion;
   (b) forming a first insulated conductor layer over said semiconductor portion;
   (c) forming an oxide layer over said first conductor layer;
   (d) forming a layer of silicon nitride over said first conductor layer;
   (e) patterning said first insulated conductor layer, to define a plurality of desired floating gates;
   (f) providing an oxidizing atmosphere to form gate insulators in selected locations of said semiconductor surface portion;
   (g) forming a second conductive layer in predetermined locations, said second conductive layer comprising control gate portions over said floating gates in said first conductor layer; and
   (h) providing a plurality of source/drain regions on opposite sides of the respective ones of said floating gates;
   (i) whereby a floating gate memory cell having very high specific capacitance between said respective floating gates and said respective control gates is formed.

18. The method of claim 17, wherein said step of forming a layer of silicon dioxide over said first conductive layer is performed by growing said oxide.

19. The method of claim 17, wherein said step of forming a layer of silicon dioxide over said first conductive layer is performed by low-pressure chemical vapor deposition of said oxide.

20. The method of claim 17, wherein said first insulated conductor layer consists essentially of polycrystalline silicon.

21. The method of claim 17, wherein said substrate has a silicon surface portion, and wherein said step of providing an oxidizing atmosphere to form gate insulators in selected locations grows silicon dioxide on portions of said silicon surface portion.

22. The method of claim 17, wherein said substrate has a silicon surface portion, and wherein said step of providing an oxidizing atmosphere to form gate insulators in selected locations grows silicon dioxide on portions of said silicon surface portion which are not protected by said layer of silicon nitride.

23. The method of claim 17, wherein said step of forming a layer of silicon nitride over said first conductive layer is performed by low-pressure chemical vapor deposition.

24. The method of claim 17, wherein said step of forming a layer of silicon nitride over said first conductive layer is performed by plasma-enhanced chemical vapor deposition.

25. The method of claim 17,
   wherein said stpe of forming a layer of silicon nitride over said first conductive layer is performed by low-pressure chemical vapor deposition,
   and an oxide layer is formed over said nitride layer by low-pressure chemical vapor deposition before said nitride layer is exposed to an atmospheric ambient,
   all prior to said step of providing an oxidizing atmosphere to form gate insulators in selected locations.

26. The method of claim 17, wherein said second conductive layer consists essentially of a layered structure including both polycrystalline silicon and metal silicide portions.

27. The method of claim 17, wherein said second conductive layer consists essentially of doped polycrystalline silicon.

28. The method of claim 17, wherein said second conductive layer consists essentially of a metal silicide.

29. The method of claim 17, wherein said second conductive layer consists essentially of a metal.

30. The method of claim 17, wherein said first insulated conductor layer consists essentially of a layered structure including both polycrystalline silicon and metal silicide portions.

31. The method of claim 17, wherein said first insulated conductor layer consists essentially of doped polycrystalline silicon.

32. The method of claim 17, wherein said first insulated conductor layer consists essentially of a metal silicide.

33. A method for making a floating gate memory, comprising the steps of:
   (a) providing a body having a silicon surface portion;
   (b) forming a first insulated conductor layer comprising polycrystalline silicon over said semiconductor portion;
   (c) depositing an oxide layer over said first conductor layer;
   (d) depositing a layer of silicon nitride over said first conductor layer, said oxide layer and said nitride layer having a total combined thickness of less than 600 Angstroms;
   (e) patterning said first insulated conductor layer, to define a plurality of desired floating gates;
   (f) providing an oxidizing atmosphere to form silicon dioxide gate insulators in selected locations of said silicon surface portion;
   (g) forming a second conductive layer in predetermined locations, said second conductive layer comprising control gate portions over said floating gates in said first conductor layer; and
   (h) providing a plurality of source/drain regions on opposite sides of the respective ones of said floating gates;
   (i) whereby a floating gate memory cell having very high specific capacitance between said respective floating gates and said respective control gates is formed.

34. The method of claim 33, wherein said step of forming a layer of silicon dioxide over said first conductve layer is performed by low-pressure chemical vapor deposition of said oxide.

35. The method of claim 33, wherein said first insulated conductor layer consists essentially of doped polycrystalline silicon.

36. The method of claim 33, wherein said step of providing an oxidizing atmosphere to form gate insulators in selected locations grows silicon dioxide on portions of said silicon surface portion which are not protected by said layer of silicon nitride.

37. The method of claim 33, wherein said step of forming a layer of silicon nitride over said first conductive layer is performed by low-pressure chemical vapor deposition.

38. The method of claim 33, wherein said step of forming a layer of silicon nitride over said first conductive layer is performed by plasma-enhanced chemical vapor deposition.

39. The method of claim 33,
wherein said step of forming a layer of silicon nitride over said first conductive layer is performed by low-pressure chemical vapor deposition,
and an oxide layer is formed over said nitride layer by low-pressure chemical vapor deposition before said nitride layer is exposed to an atmospheric ambient,
all prior to said step of providing an oxidizing atmosphere to form gate insulators in selected locations.

40. The method of claim 33, wherein said second conductive layer consists essentially of a layered structure including both polycrystalline silicon and metal silicide portions.

41. The method of claim 33, wherein said second conductive layer consists essentially of doped polycrystalline silicon.

42. The method of claim 33, wherein said second conductive layer consists essentially of a metal silicide.

43. The method of claim 33, wherein said second conductive layer consists essentially of a metal.

44. The method of claim 33, wherein said first insulated conductor layer consists essentially of a layered structure including both polycrystalline silicon and metal silicide portions.

45. The method of claim 33, wherein said first insulated conductor layer consists essentially of doped polycrystalline silicon.

* * * * *